United States Patent [19]

Tsuji et al.

[11] Patent Number: 4,792,534

[45] Date of Patent: Dec. 20, 1988

[54] METHOD OF MANUFACTURING A SEMICONDUCTOR DEVICE INVOLVING SIDEWALL SPACER FORMATION

[75] Inventors: Hitoshi Tsuji; Tiharu Kato, both of Yokohama; Kiyoshi Takaoki, Ebina, all of Japan

[73] Assignee: Kabushiki Kaisha Toshiba, Kawasaki, Japan

[21] Appl. No.: 942,076

[22] Filed: Dec. 15, 1986

[30] Foreign Application Priority Data

Dec. 25, 1985 [JP] Japan ................. 60-295063

[51] Int. Cl.$^4$ ......................................... H01L 21/308
[52] U.S. Cl. ..................................... 437/229; 437/31; 437/228; 437/245
[58] Field of Search ................. 156/643, 657, 653; 148/DIG. 51, 187, DIG. 126; 29/578; 357/34; 437/31, 32, 33, 225, 228, 229, 245

[56] References Cited

U.S. PATENT DOCUMENTS

| 4,472,240 | 9/1984 | Kameyama | 156/653 |
| 4,532,002 | 7/1985 | White | 156/653 |
| 4,543,707 | 10/1985 | Ito et al. | 156/653 |
| 4,557,797 | 12/1985 | Fuller et al. | 437/16 |

FOREIGN PATENT DOCUMENTS 0004238 1/1981 Japan ........................ 29/576 B

OTHER PUBLICATIONS

Hafner et al. "Method of Producing Thin Film Patterns", vol. 26 #1 1983, pp. 276–277.
Bergasse et al. ". . . Two Levels of Metallurgy", IBM TDB, vol. 15 #8 1973, pp. 2407–2408.
Kaplan "Metals as Resists . . . ", IBM TDB, vol. 12 #12 1970, p. 2087.
Patel, K. "Plasma Etching . . . ", IBM TDB, vol. 20 #6 1977, pp. 2200–2201.
Gzarnyj et al., "Dry Development . . . ", vol. 24 #10 1982, pp. 5095–5096.
1983 Report of the Institute of Electronics and Communications Engineers of Japan, T. Furutsuka et al.

Primary Examiner—Brian E. Hearn
Assistant Examiner—Kevin McAndrews
Attorney, Agent, or Firm—Finnegan, Henderson, Farabow, Garrett & Dunner

[57] ABSTRACT

A method of manufacturing a semiconductor device having a submicron pattern. A p-type semiconductor layer is formed on an n-type semiconductor substrate. Insulating films are formed on the p-type semiconductor layer. A first mask layer, such as an aluminum layer having an etching rate different from that of the insulating films, is formed on the insulating films. A second mask layer having an etching rate different from that of the first mask layer, is formed on the first mask layer. The second mask layer is patterned. A coating film having an etching rate different from that of the first insulating film, is formed on the resultant structure. The coating film is etched to be left on a side wall of the patterned second mask layer. The first mask layer is patterned, using the residual coating film and the patterned second mask layer as masks, and a pattern finer than that of the resist is formed in the first mask layer. The insulating film is patterned, using the patterned first mask layer, and a pattern finer than that of the resist is formed in the insulating film. In the p-type semiconductor layer n+-type emitter and p+ base leading regions are formed, and the n-type semiconductor layer serves as a collector.

5 Claims, 4 Drawing Sheets

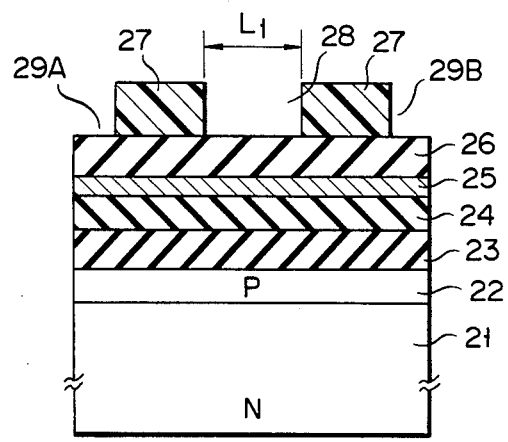
F I G. 1A
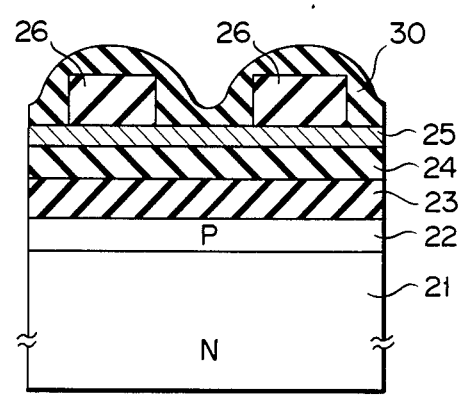
F I G. 1B
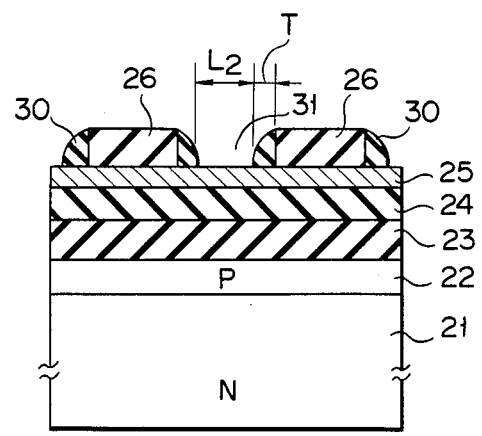
F I G. 1C

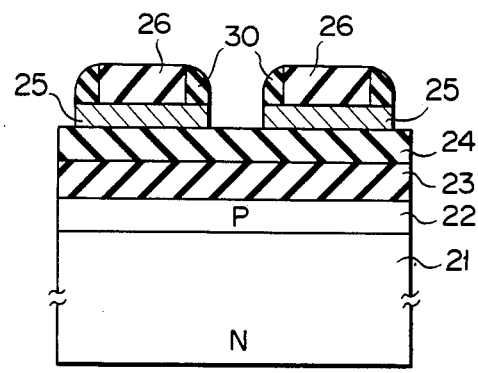
F I G. 1D
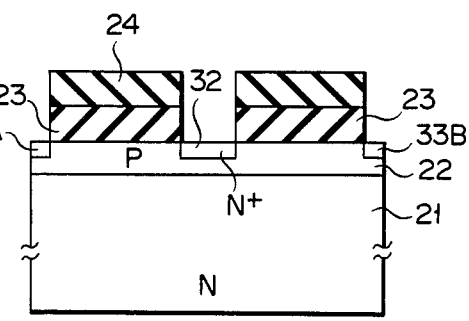
F I G. 1E
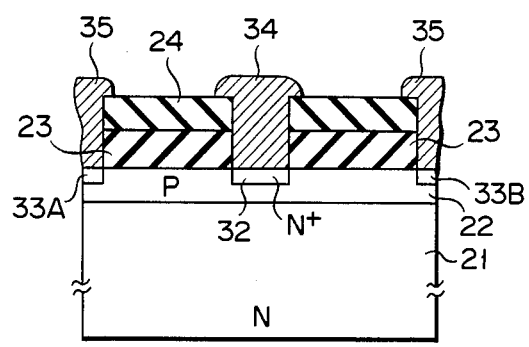
F I G. 1F

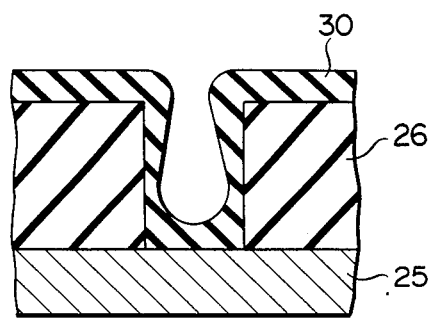
F I G. 4
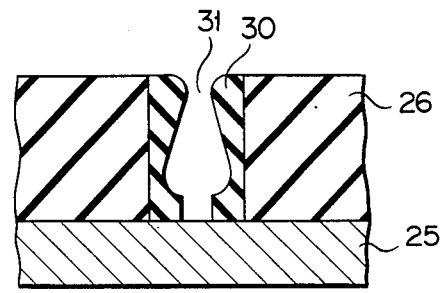
F I G. 5
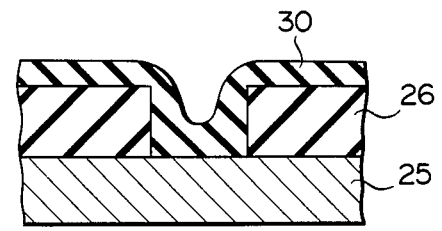
F I G. 6
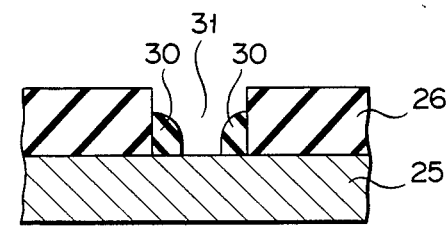
F I G. 7

METHOD OF MANUFACTURING A SEMICONDUCTOR DEVICE INVOLVING SIDEWALL SPACER FORMATION

BACKGROUND OF THE INVENTION

The present invention relates to a method of manufacturing a semiconductor device and, more specifically, to a method of fabricating an insulating film, using a dry-etching method, such as Reactive Ion Etching (RIE) and a method of manufacturing a semiconductor device using the above fabrication method.

A quantity of $\mu$ wave transistors is formed in the manner described below.

A p-type layer is formed on an n-type semiconductor substrate. A silicon oxide film and a silicon nitride film are sequentially deposited on the p-type layer. A resist film such as a Deep-UV resist or an UV resist is formed on the silicon nitride film. A resist of a predetermined pattern is formed, using a method for forming a thin resist film. The silicon nitride and oxide films are selectively etched, using the resist as a mask, by dry etching, such as by the RIE method. The resist is then removed. An emitter and a base are formed in the p-type layer, using the residual silicon oxide and nitride films. The electrodes of the emitter and the base are then formed. Note that the n-type semiconductor serves as a collector.

However, when this method is applied to the manufacture of semiconductor devices having submicron patterns (a pattern having a size of less than 1 $\mu$m), the above manufacturing method has the following drawbacks:

(1) In order to form a submicron pattern, contact exposure using Deep-UV light is used. However, when the contact exposure method is used, if any substance is attached to a wafer, pattern size variations in the wafer are increased. Depending on the size of the attached substance, no pattern can be formed in an area of 1 to 2 cm around it.

(2) When a submicron pattern is to be formed, any mask alignment error must be less than 0.3 to 0.5 $\mu$m. In other words, when one pattern is formed and then another pattrrn is formed thereon, reliability zone $3\sigma$ of variations in the mask alignment is $3\sigma = 0.3$ to $0.5$ $\mu$m, so that a high mask alignment accuracy is required between the two masks. However, it is difficult to obtain the above accuracy, using an existing mask aligner. In order to improve the mask alignment accuracy, a stepper has been considered and used in mass production recently. However, even when a stepper is used to form patterns, the limit of a pattern width is 1 $\mu$m at a mass production level and the machine limit is about 0.8 $\mu$m. Accordingly, only patterning with an improved accuracy of 1.0 to 1.2 $\mu$m level can be performed, using the stepper.

(3) As for the RIE resistance of, for example, the Deep-UV resist, the Deep-UV resist has a relatively weak resistance, thereby considerably limiting the RIE conditions. Therefore, when the semiconductor wafers are actually manufactured, the throughput is decreased.

As has been described above, it is difficult to manufacture the semiconductor devices having submicron patterns, when using a conventional manufacturing method.

SUMMARY OF THE INVENTION

An object of the present invention is to provide a method of fabricating an insulating film capable of forming a submicron pattern with high accuracy, and a method of manufacturing a semiconductor device having a submicron pattern.

In order to achieve the above object, a method of manufacturing a semicoductor device according to the present invention comprises the steps of:
  forming at least one insulating film on a semiconductor body;
  forming a first layer having an etching rate different from that of the insulating film, on the insulating film;
  forming a second layer having an etching rate different from that of the first layer, on the first layer;
  patterning the second layer, to obtain a predetermined pattern;
  forming a coating film having an etching rate different from that of the first layer, on the resultant structure;
  etching the coating film left on at least one side wall of the patterned second layer;
  patterning the first layer, using the residual coating film and the patterned second layer as masks; and
  patterning the insulating film, using the patterned first layer as a mask.
  With the above arrangemet, according to the present invention, a pattern finer than that of the second layer can be formed on the insulating film, having a high mask alignment accuracy. In particular, the thickness of the residual coating film on the side wall of the second mask layer can be controlled relatively easily, by properly setting the etching conditions for the coating film. Therefore, even when the pattern to be formed on the second layer can be formed sufficiently accurately by a mask aligner of about 1 $\mu$m, a pattern of about 0.5 $\mu$m can be formed on the insulating film, by setting the thickness of the residual coating film on the side wall of thes second mask layer at 0.25 $\mu$m, thereby improving the mask alignment accuracy and forming the submicron pattern with ease. In addition, since the second layer can be patterned by projection exposure, size variations in a wafer do not occur as when the contact exposure method is used. As has been described above, a submicron pattern with high accuracy can be obtained even when the resolution of the mask aligner or of the stepper is low.

BRIEF DESCRIPTION OF THE DRAWINGS

FIGS. 1A to 1F are sectional views for explaining a method of manufacturing $\mu$ wave transistors according to one embodiment of the present invention;

FIGS. 4 to 7 are sectional views for explaining the configuration of a residual coatig film on the side walls of a resists.

DETAILED DESCRIPTION OF THE INVENTION

Figure 2:
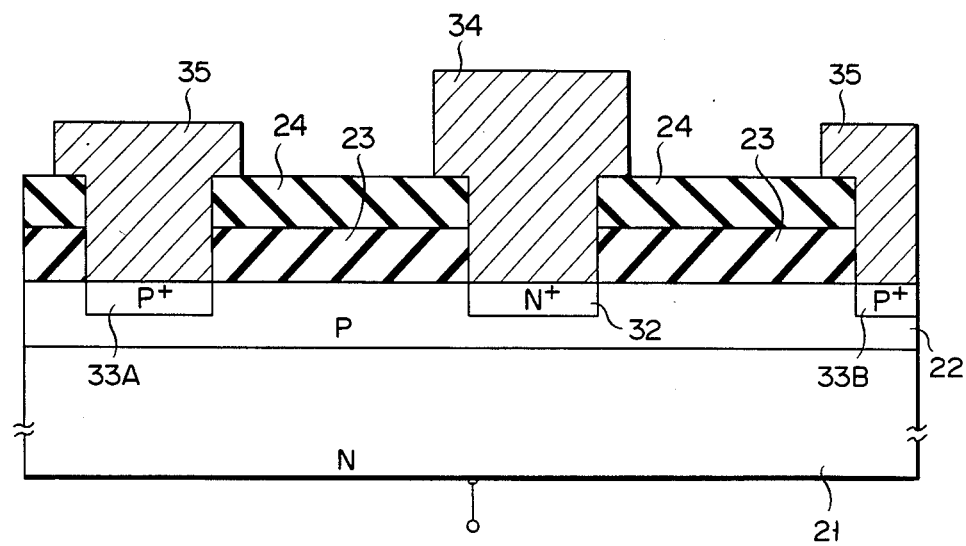
FIG. 2 is a sectional view showing FIG. 1F in detail.

A method of manufacturing μ wave transistors according to one embodiment of the present invention will now be described in detail, with reference to FIGS. 1A to 1F.

(A) N-type silicon substrate 21 is prepared. P-type layer 22 having a resistivity of, for example, 0.4 to 0.7 Ω.cm and a thickness of 2 to 4 μm, is formed on substrate 21 by an epitaxial method or the like. Silicon oxide film 23 is formed on layer 22 by a plasma CVD method or the like. Silicon nitride film 24 is formed on film 23 by the plasma CVD method or the like. Layer 25 of a first mask material (to be referred to as a first mask layer hereinafter) composed of Al and having a thickness of 50 to 100 nm, is formed on film 24. Layer 26 of a second mask material (to be referred to as a second mask layer hereinafter) composed of $SiO_2$ or SiON and having a thicknessof 250 nm or more, is formed on first mask layer 25. A resist film (not shown) is formed on second mask layer 26. The resist film is patterned to form resists 27. Resists 27 are formed to have comb-shape openings, because the emitter and base of the μ wave transistor are formed in a comb-shape, this configuration to be described later. The size (i.e., the diameter) of the openings formed in resists 27 takes into consideration the width of the emitter, and the thickness T of the coating films, both described later. For example, when an emitter having a width of about 0.5 μm is to be formed, resists 27 are formed to have an opening having a width L1 of about 1 μm on a prospective emitter region. Since width L1 of the opening is about 1 μm, the resist film can be exposed by projection exposure, using the stepper, so that the contact exposure process is not necessary. The structure shown in FIG. 1A is obtained by way of the above steps. In FIG. 1A, space 28 is an opening for forming an emitter having a width of L1 (e.g., 1 μm), and reference numerals 29A and 29B denote openings for forming bases.

(B) Second mask layer 26 is selectively etched, using resists 27 as a mask, by means of the RIE method, using a mixture of $CF_4$ and $O_2$ gases. Resists 27 are then removed. Coating film 30 consisting of $SiO_2$, SiN, and the like is isotropically deposited on the resultant structure, by means of the plasma CVD method or the like. The structure shown in FIG. 1B is obtained by way of the above steps.

(C) Coating film 30 is etched by means of the RIE method, using a mixture of $CF_4$ and $O_2$ gases. Coating films 30 are left on the side wall of patterned layers 26, by properly adjusting the etching conditions, the etching time, and the like. Thickness T of residual coating films 30 can be controlled with relative ease and accuracy, by properly adjusting the electrical field intensity, the vacuum pressure, the gas flow rate, the process time, and the like. The structure shown in FIG. 1C is obtained by way of the above steps. In FIG. 1C, when width L1, shown in FIG. 1A, is 1 μm and thickness T of residual coating films 30 is set to be 0.55 μm, opening 31 having width L2=0.5 μm is obtained.

(D) Layer 25 is selectively etched by means of the RIE method, using patterned layers 26 and residual coating films 30 as masks, and gas including chlorine. During the etching process, film 24, patterned layers 26, and residual coating films 30 are not etched. The structure shown in FIG. 1 is obtained by way of the above step.

(E) Patterned layer 26 and residual coating films 30 are removed. Films 24 and 23 are selectively etched, using patterned layers 25 as masks, by means of the RIE method, using a mixture of $CF_4$ and $O_2$ gases. In the above steps, patterns of films 23 and 24 having a width of about L2 (e.g., 0.5 μm), which is beyond the limit of resolution of the stepper, are formed, to be accurately aligned with the pattern of layer 26. Residual portions of layer 25 are removed, using a mixture of sulfuric acid and hydrogen peroxide. Using films 24 and 23 and a resist, formed as needed, as masks, n- and p-type impurities are implanted (diffused or ion-implanted) in prospective emitter and base regions in layer 22, respectively, and $n^+$-type emitter region 32 and $p^+$-type base leading regions 33A and 33B are formed. Similar to the patterns of films 23 and 24, patterns (a base region and emitter leading regions) are formed with high alignment accuracy. Note that substrate 21 serves as a collector. A structure shown in FIG. 1E is obtained by way of the above steps.

Figure 3:
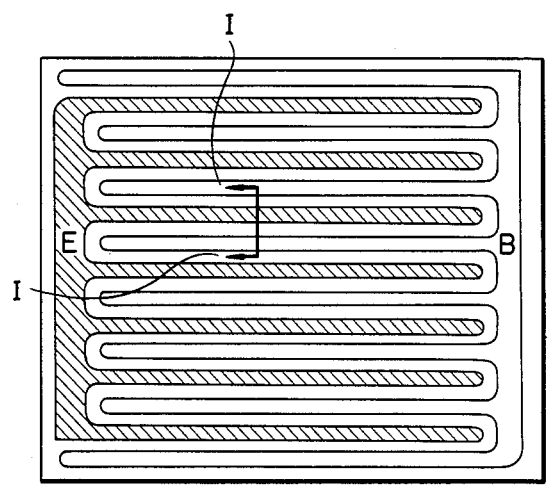
FIG. 3 is a plan view of the positional relationship between the emitter and the base of the $\mu$ wave transistor manufactured by the method according to the embodiment of the present invention.

(F) An aluminum film is formed on the resultant structure. The aluminum film is then patterned to form emitter electrode 34 to be connected to emitter region 32, and base electrodes 35 to be connected to base leading regions 33A and 33B, respectively. A μ wave transistor having the structure shown in FIG. 1F, is obtained by the above step. FIG. 2 is an enlarged view of FIG. 1F. FIG. 3 is a plan view of FIG. 1F. Note that in FIG. 3, in order to clarify the positional relationship between the base and emitter, other portions are omitted. For better understanding, the emitter is hatched, although it is not a cross-section. FIG. 2 is a sectional view taken along the line I—I of FIG. 3.

As has been described above, in this embodiment, second mask layer 26 is patterned, using resists 27. Coating film 30 is then formed. Coating film 30 is etched by means of the RIE method and is left on the side walls of patterned layer 26. First mask layer 25 is etched, using patterned aayer 26 and residual coating films 30 as masks. Silicon nitride film 24 an silicon oxide film 23 are etched, using patterned layer 25 as masks. As a result of these process steps, the accuracy of mask alignment can be improved as compared to that in a conventional method. In addition, a pattern of resists 27 may be about 1 μm. Projection exposure with UV light may be used to form a pattern of about 1 μm. For this reason, size variations in a wafer do not occur, even when the diameter of a wafer is large. Moreover, since it is protected by layer 25, film 24 will not be damaged by the predetermined RIE of FIG. 1B when coating film 30 is etched by means of the RIE method.

In the above embodiment, the form of residual coating films 30 on the side walls of patterned layers 26 depends on the sizes of openings 28 and 29, and the thickness of layers 26. For example, when layers 66 are thick and coating film 30 is deposited as shown in FIG. 4, coating film 30 is etched as shown in FIG. 5. On the other hand, when layers 26 are thin and coating film 30 is deposited as shown in FIG. 6, coating film 30 is etched as shown in FIG. 7. Accordingly, coating film 30 can be left on the side walls of layers 26 regardless of its thickness. Thus, the present invention is applicable regardlsss of whether layers 26 are thick or thin.

The materials of layers 25, 26, and the like are not limited to those described in the above embodiment. The materials of layer 25 need only have an etching rate different from those of films 23 and 24. Layer 26 and coating film 30 need only have etching rates different from that of layer 25. Resists 27 need only have an etching rate different from that of layer 26. For example, as a first material, another material, such as Ti, may be used instead of Al.

As has been described in detail, according to the present invention, a submicron pattern can be formed in a wafer, with high alignment accuracy without size variations.

In the above embodiment, layer 26 is formed on layer (aluminum film) 25, and resists 27 are formed on layer 26. However, resists 27 may be formed directly on layer 25, and residual coating films 30 may be provide on the side walls of resists 27. In this case, the resist film may not be patterned accurately because of diffused reflection of the light from aluminum layer 25. In order to prevent this, in the present invention, insulating film 26 is provided on aluminum layer 25. Layers 23 and 24 need not be bi-layered but may be a single layer such an a silicon oxide film.

In the above embodiment, the description has been made for the case wherein electrodes 34 and 35 are connected directly to emitter and base regions 32, 33a and 33b, respectively. However, arsenic silicon may be used as a diffusion source, for forming emitter region 32, and a portion of the arsenic silicon may be left on the emitter, so that an aluminum electrode may be formed to contact the residual arsenic silicon. With this arrangement, a good contact between the emitter and the electrode can be obtained. This technique also applies to the base electrode. A portion of a material for p-type impurity diffusion may be left on the base, so that an aluminum electrode may be formed to contact it.

In the above embodiment, the description has been made for the case wherein the present invention is applied to a μ wave transistor. This is because the base and emitter of the μ wave transistor are like combs, as is shown in FIG. 3, so that a finer base and emitter and a finer pattern are required. However, the present invention is not limited to this embodiment. The present invention can be applied widely to a method of manufacturing normal bipolar transistors and MOS transistors, and to the case wherein the formation of a submicron pattern, for example, the patterning and etching of an insulating film, an electrode layer, a substrate, and the like (in other words, patterning in a range close to or beyond the limits of a stepper, a mask aligner, or the like), is to be performed accurately.

What is claimed is:

1. A method of manufacturing a semiconductor device, comprising the steps of:
    forming at least one insulating film on a semiconductor body;
    forming a metal first mask layer on said insulating film;
    forming an insulating second mask layer on said first mask layer;
    forming a resist film on said insulating second mask layer and patterning said resist film to form a resist;
    patterning said insulating second mask layer by etching using said patterned resist as a mask;
    forming a coating film on the resultant structure;
    etching said coating film to be left on at least one side wall of said patterned second mask layer;
    patterning said metal first mask layer, by etching using the residual coating film and said patterned second mask layer as masks; and
    patterning said insulating film by etching, using said patterned metal first mask layer as a mask.

2. A method according to claim 1, wherein:
    said semiconductor body consists of a semiconductor layer of a first conductivity type and a semiconductor layer of a second conductivity type formed on said semiconductor layer of the first conductivity type,
    said insulating film is formed on said semiconductor layer of the second conductivity type,
    and said method further comprises the steps of doping an impurity in said semiconductor layer of the second conductivity type, to form an emitter region of the first conductivity type and a base leading region of the second conductivity type; and
    forming an emitter electrode and a base electrode.

3. A method of manufacturing a μ wave transistor, comprising the steps of:
    preparing a semiconductor body having a semiconductor layer of a first conductivity type as a collector region, and a semi-conductor layer of a second conductivity type as a base region formed on said semiconductor layer of the first conductivity type;
    forming at least one first insulating layer on said semiconductor layer of the second conductivity type;
    forming a metal first mask layer on said first insulating layer;
    forming a second insulating mask layer on said metal first mask layer;
    forming a resist film on said second insulating layer;
    patterning said resist film to obtain a pattern having openings above an emitter region and a base leading region;
    patterning said second insulating layer, by etching using said patterned resist film as a mask;
    forming a third insulating layer on the resultant structure;
    dry-etching said third insulating layer to be left on at least one side wall of said patterned second insulating layer;
    patterning said metal first mask layer, by etching using the residual third insulating layer and said patterned second insulating layer as masks;
    patterning said first insulating layer, by etching using said patterned metal first mask layer as a mask for forming contact holes for the emitter region and the base leading region;
    forming the emitter region and the base leading region in said semiconductor layer of the second conductivity type; and
    forming an emitter electrode and a base electrode electrically contacting said emitter and base leading regions, respectively.

4. A method of manufacturing a semiconductor device, comprising the steps of:
    forming at least one first insulating layer on a semiconductor body;
    forming a metal layer on said first insuating layer;
    forming a second insulating layer on said metal layer;
    forming a resist layer on said second insulating layer;
    patterning said resist layer to obtain a pattern;
    etching said second insulating layer, using said patterned resist layer as a mask;
    etching said metal layer, using said etched second insulating layer as a mask; and
    etching said first insulating layer, using said etched metal layer as a mask.

5. A method of manufacturing a semiconductor device, comprising the steps of:

preparing a semiconductor body having a semiconductor layer of a first conductivity type and a semiconductor layer of a second conductivity type formed on said semiconductor layer of the first conductivity type;

forming at least one insulating film on said semiconductor substrate of the second conductivity type;

forming a first mask layer consisting essentially of a metal on said at least one insulating film;

forming an insulating second mask layer on said metal first mask layer;

forming a resist film on said insulating second mask layer;

patterning said resist film to form a resist;

patterning said insulating second mask layer by dry etching said insulating second mask layer using said resist as a mask;

removing said resist;

forming an insulating coating film on the resultant structure;

dry etching said insulating coating film to leave the insulating coating film as a residual film on at least one side wall of said patterned insulating second mask layer;

patterning said metal first mask layer by dry etching said metal first mask layer using said patterned insulating second mask layer and said residual insulating coating film as a mask;

removing said patterned insulating second mask layer and said residual insulating coating film;

patterning said at least one insulating film by dry etching said at least one insulating film using said patterned metal first mask layer as a mask;

removing said patterned metal first mask layer;

doping an impurity of the first conductivity type to form an emitter region and of the second conductivity type to form a base-leading region, into said semiconductor layer of the second conductivity type, using said patterned at least one insulating film as a mask; and forming an emitter electrode connected to the emitter region and a base electrode connected to the base leading region.

* * * * *